(12) United States Patent
Hu et al.

(10) Patent No.: US 11,365,115 B2
(45) Date of Patent: Jun. 21, 2022

(54) PIEZOELECTRIC ANTI-STICTION STRUCTURE FOR MICROELECTROMECHANICAL SYSTEMS

(71) Applicant: Taiwan Semiconductor Manufacturing Co., Ltd., Hsin-Chu (TW)

(72) Inventors: Fan Hu, Taipei (TW); Chun-Ren Cheng, Hsin-Chu (TW); Hsiang-Fu Chen, Zhubei (TW); Wen-Chuan Tai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 41 days.

(21) Appl. No.: 16/558,539

(22) Filed: Sep. 3, 2019

(65) Prior Publication Data
US 2021/0061641 A1    Mar. 4, 2021

(51) Int. Cl.
*B81B 3/00* (2006.01)
*B81C 1/00* (2006.01)

(52) U.S. Cl.
CPC ........ *B81B 3/0013* (2013.01); *B81C 1/00968* (2013.01); *B81B 2203/0109* (2013.01); *B81B 2203/04* (2013.01); *B81B 2207/012* (2013.01); *B81B 2207/03* (2013.01); *B81B 2207/07* (2013.01)

(58) Field of Classification Search
CPC ........ B81C 1/00968; B81C 2203/0792; B81C 2203/0109; B81C 2203/035; B81C 1/00134; B81B 3/0013; B81B 2203/0109; B81B 2203/04; B81B 2207/012; B81B 2207/03; B81B 2207/07; B81B 2201/0235; B81B 2201/0242; B81B 2203/053; B81B 2207/015; B81B 7/04; B81B 2201/02
See application file for complete search history.

(56) References Cited

U.S. PATENT DOCUMENTS

| | | | |
|---|---|---|---|
| 9,365,416 B2 | 6/2016 | Shu et al. | |
| 9,630,832 B2 * | 4/2017 | Lin | B81B 7/007 |
| 9,738,516 B2 * | 8/2017 | Chou | B81B 7/007 |
| 2004/0032012 A1 * | 2/2004 | Wong | H03H 9/0547 |
| | | | 257/678 |

(Continued)

*Primary Examiner* — Shahed Ahmed
*Assistant Examiner* — Khatib A Rahman
(74) *Attorney, Agent, or Firm* — Eschweiler & Potashnik, LLC

(57) ABSTRACT

Various embodiments of the present disclosure are directed towards a microelectromechanical system (MEMS) device. The MEMS device includes a first dielectric structure disposed over a first semiconductor substrate, where the first dielectric structure at least partially defines a cavity. A second semiconductor substrate is disposed over the first dielectric structure and includes a movable mass, where opposite sidewalls of the movable mass are disposed between opposite sidewall of the cavity. A first piezoelectric anti-stiction structure is disposed between the movable mass and the first dielectric structure, wherein the first piezoelectric anti-stiction structure includes a first piezoelectric structure and a first electrode disposed between the first piezoelectric structure and the first dielectric structure.

20 Claims, 10 Drawing Sheets

(56) References Cited

U.S. PATENT DOCUMENTS

| | | | |
|---|---|---|---|
| 2013/0307857 A1* | 11/2013 | Aflatooni | G02B 26/001 345/501 |
| 2014/0145244 A1* | 5/2014 | Daneman | B81C 3/001 257/254 |
| 2016/0167945 A1* | 6/2016 | Chang | B81B 3/001 257/415 |
| 2016/0355394 A1* | 12/2016 | Tseng | B81C 1/00293 |
| 2017/0203962 A1* | 7/2017 | Cheng | B81C 1/00285 |
| 2017/0210612 A1* | 7/2017 | Chen | B81B 3/001 |
| 2018/0222744 A1* | 8/2018 | Haubold | B81B 3/0021 |
| 2018/0261756 A1* | 9/2018 | Akiyama | H01L 41/0533 |
| 2019/0062153 A1 | 2/2019 | Tseng et al. | |
| 2019/0092627 A1 | 3/2019 | Lin et al. | |

* cited by examiner

PIEZOELECTRIC ANTI-STICTION STRUCTURE FOR MICROELECTROMECHANICAL SYSTEMS

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, the use of MEMS devices as sensing devices (e.g., motion sensing devices, pressure sensing devices, acceleration sensing devices, etc.) has become widespread in many of today's personal electronics (e.g., smart phones, fitness electronics, personal computing devices). MEMS devices are also used in other applications, such as vehicle applications (e.g., for accident detection and airbag deployment systems), aerospace applications (e.g., for guidance systems), medical applications (e.g., for patient monitoring), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
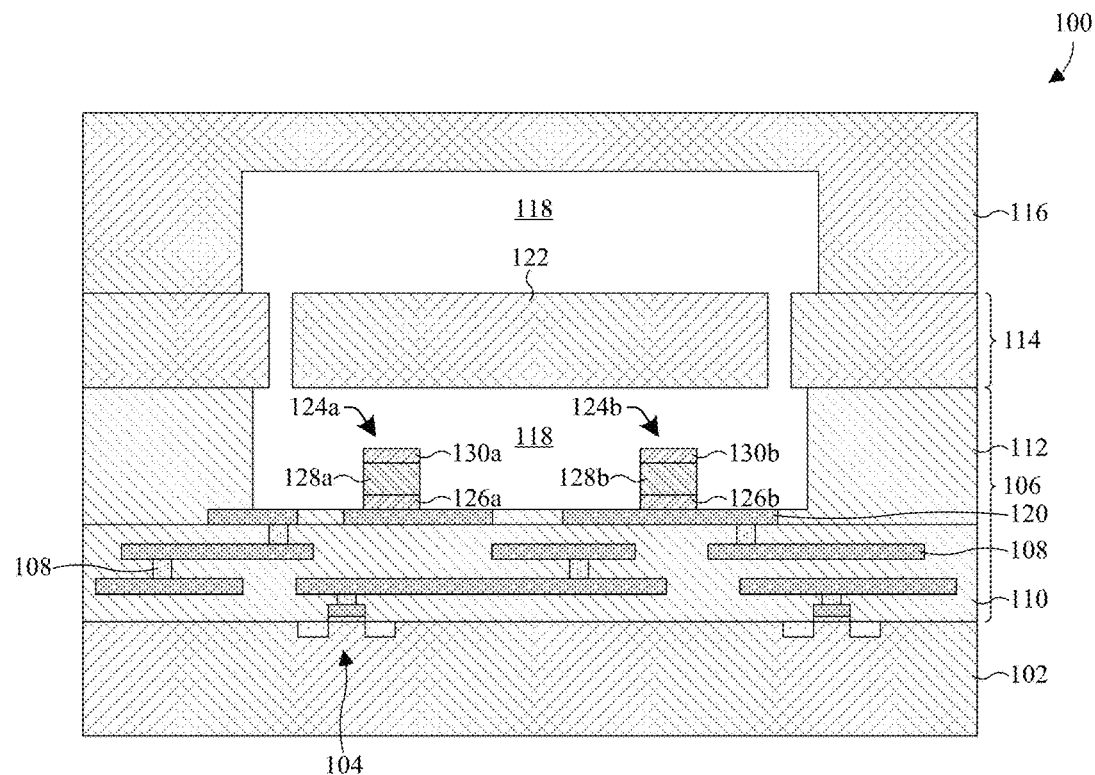
FIG. 1 illustrates a cross-sectional view of some embodiments of a microelectromechanical system (MEMS) device comprising a piezoelectric anti-stiction structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many MEMS devices (e.g., accelerometers, gyroscopes, etc.) comprise a movable mass and a fixed electrode plate. The movable mass has a planar surface aligned in parallel and spaced apart from an opposed planar surface of the fixed electrode plate. In response to external stimuli (e.g., pressure, acceleration, gravity, etc.), the movable mass is displaced inside a cavity. This displacement changes a distance between the movable mass and the fixed electrode plate. The change in distance may be detected by a change in capacitive coupling between the movable mass and the fixed electrode and analyzed by appropriate electrical circuits to derive a measurement of a physical quantity associated with the change in distance, such as acceleration.

One of the design challenges with MEMS devices is to prevent the movable mass from sticking to adjacent parts of the MEMS device, an effect known as stiction. As the scale of these devices continues to shrink, and spacing between adjacent surfaces becomes smaller, prevention of unintended stiction becomes an increasingly important design consideration. Stiction can occur under a number of conditions. During manufacturing, stiction can occur when, for example, the movable mass is not fully released from its neighboring surface. Stiction can also occur during normal operation when the movable mass deflects to a point in which the movable mass comes into contact with neighboring parts (e.g., surface of a cavity, surface of a stopper/bump, etc.).

Various embodiments of the present application are directed toward a MEMS device having a piezoelectric anti-stiction structure. The MEMS device includes an interlayer dielectric (ILD) structure that is disposed over a first semiconductor substrate. An upper surface of the ILD structure at least partially defines a bottom of a cavity. A second semiconductor substrate is disposed over the ILD structure and comprises a movable mass. In response to external stimuli, the movable mass is configured to be displaced within the cavity. The piezoelectric anti-stiction structure comprises a piezoelectric structure and an electrode. Further, the piezoelectric anti-stiction structure is disposed between the moveable mass and the upper surface of the ILD structure. Because the piezoelectric anti-stiction structure is disposed between the moveable mass and the upper surface of the ILD structure, the piezoelectric anti-stiction structure may prevent/correct stiction.

For example, if the movable mass deflects beyond a given point towards the bottom of the cavity, the piezoelectric anti-stiction structure will prevent the movable mass from contacting the bottom of the cavity and potentially sticking to the upper surface of the ILD structure. Thus, if the movable mass were to stick to a neighboring part, the movable mass would stick to the piezoelectric anti-stiction structure. If the movable mass becomes stuck to the piezoelectric anti-stiction structure, a voltage can be applied to the electrode that is sufficient to cause the piezoelectric structure to deform (or vibrate), thereby generating a mechanical force that may release the movable mass from its stuck state on the piezoelectric anti-stiction structure.

Another example of the piezoelectric anti-stiction structure preventing/correcting stiction may comprise the movable mass having a first doping type. In such embodiments, a first voltage is applied to the electrode, and a second voltage is applied to the movable mass. Thus, a voltage across the piezoelectric structure will differ based on a distance the movable mass is from the electrode. Accordingly, if the movable mass deflects beyond a given point towards the bottom of the cavity (e.g., contacting the piezoelectric anti-stiction structure), the distance between the movable mass and the electrode will cause the voltage across the piezoelectric anti-stiction structure to be sufficient to cause the piezoelectric structure to deform, thereby generating a mechanical force that may release the movable mass from its stuck state on the piezoelectric anti-stiction structure.

FIG. 1 illustrates a cross-sectional view of some embodiments of a microelectromechanical system (MEMS) device 100 comprising a piezoelectric anti-stiction structure. The MEMS device 100 may be, for example, an accelerometer, a gyroscope, or some other MEMS device.

As shown in FIG. 1, the MEMS device 100 comprises a first semiconductor substrate 102. The first semiconductor substrate 102 may comprise any type of semiconductor body (e.g., monocrystalline silicon/CMOS bulk, silicon-germanium (SiGe), silicon on insulator (SOI), etc.). In some embodiments, one or more semiconductor devices 104 may be disposed on/in the first semiconductor substrate 102. In further embodiments, the semiconductor devices 104 may be or comprise, for example, metal-oxide-semiconductor (MOS) field-effect transistors (FETs), some other MOS devices, or some other semiconductor devices. In yet further embodiments, the first semiconductor substrate 102 may be referred to as a complementary metal-oxide-semiconductor (CMOS) substrate.

An interlayer dielectric (ILD) structure 106 is disposed over the first semiconductor substrate 102 and the semiconductor devices 104. An interconnect structure 108 (e.g., copper interconnect) is embedded in the ILD structure 106. The interconnect structure 108 comprises a plurality of conductive features (e.g., metal lines, metal vias, metal contacts, etc.). In some embodiments, the ILD structure 106 comprises one or more stacked ILD layers, which may respectively comprise a low-k dielectric (e.g., a dielectric material with a dielectric constant less than about 3.9), an oxide (e.g., $SiO_2$), or the like. In further embodiments, the ILD structure 106 comprises a lower ILD structure 110 and an upper ILD structure 112 disposed over the lower ILD structure 110. In yet further embodiments, the plurality of conductive features may comprise, for example, copper (Cu), aluminum (Al), tungsten (W), titanium nitride (TiN), aluminum-copper (AlCu), some other conductive material, or a combination of the foregoing.

A second semiconductor substrate 114 is disposed over both the ILD structure 106 and the first semiconductor substrate 102. The second semiconductor substrate 114 may comprise any type of semiconductor body (e.g., monocrystalline silicon/CMOS bulk, SiGe, SOI, etc.). In some embodiments, the second semiconductor substrate 114 may have a first doping type (e.g., p-type/n-type). In further embodiments, the second semiconductor substrate 114 may be referred to as a MEMS substrate. In further embodiments, a third semiconductor substrate 116 is disposed over both the second semiconductor substrate 114 and the first semiconductor substrate 102. The third semiconductor substrate 116 may comprise any type of semiconductor body (e.g., monocrystalline silicon/CMOS bulk, SiGe, SOI, etc.). In yet further embodiments, the third semiconductor substrate 116 may be referred to as a cap substrate.

The ILD structure 106 at least partially defines a cavity 118. In some embodiments, the upper ILD structure 112, the interconnect structure 108, the second semiconductor substrate 114, and the third semiconductor substrate 116 define the cavity 118. In further embodiments, an upper conductive line 120 of the interconnect structure 108 may at least partially define the cavity 118. For example, the upper conductive line 120 and an upper surface of the upper ILD structure 112 may define a bottom surface of the cavity 118, and a bottom surface of the third semiconductor substrate 116 may define an upper surface of the cavity 118. In further embodiments, the upper conductive line 120 of the interconnect structure 108 may be the uppermost conductive line (e.g., uppermost metal line) of the interconnect structure 108. In yet further embodiments, the third semiconductor substrate 116 at least partially defines an upper portion of the cavity 118, and the upper ILD structure 112 at least partially defines a lower portion of the cavity 118.

The second semiconductor substrate 114 comprises a movable mass 122 (e.g., proof mass). The movable mass 122 is a portion of the second semiconductor substrate 114 that is suspended in the cavity 118 by one or more tethers (not shown). In some embodiments, the movable mass 122 has the first doping type (e.g., p-type) or a second doping type (e.g., n-type) opposite the first doping type. In further embodiments, the movable mass 122 may have a first doping concentration of first doping type dopants (e.g., p-type dopants) that is greater than or equal to about $1 \times 10^{20}$ cm$^{-3}$, or a second doping concentration of second doping type dopants (e.g., n-type dopants) that is greater than or equal to about $1 \times 10^{20}$ cm$^{-3}$. In yet further embodiments, opposite sidewalls of the movable mass 122 are disposed between opposite sidewall of the upper ILD structure 112.

A plurality of piezoelectric anti-stiction structures 124 are disposed in the cavity 118. For example, a first piezoelectric anti-stiction structure 124a and a second piezoelectric anti-stiction structure 124b are disposed in the cavity 118 and spaced apart. In some embodiments, the piezoelectric anti-stiction structures 124 are disposed between an upper surface of the upper ILD structure 112 and the movable mass 122. It will be appreciated that, in some embodiments, only a single piezoelectric anti-stiction structure may be disposed in the cavity 118.

For clarity, features of the piezoelectric anti-stiction structures 124 may be described in reference to only one of the piezoelectric anti-stiction structures 124 (e.g., the first piezoelectric anti-stiction structure 124a), and it will be appreciated that each of the plurality of piezoelectric anti-stiction structures 124 may also comprise such features. For example, the first piezoelectric anti-stiction structure 124a comprises a first electrode 126a. Therefore, it will be appreciated that the second piezoelectric anti-stiction structure 124b may comprise a second electrode 126b (and any other piezoelectric anti-stiction structure may also comprise an electrode).

The first piezoelectric anti-stiction structure 124a comprises a first piezoelectric structure 128a disposed on the first electrode 126a. In some embodiments, a first conductive structure 130a is disposed on the first piezoelectric structure 128a. In further embodiments, the first electrode 126a is electrically coupled to one or more of the semiconductor devices 104 via the interconnect structure 108. In further embodiments, the first electrode 126a is electrically coupled to the upper conductive line 120.

The first electrode 126a may comprise, for example, platinum (Pt), titanium (Ti), copper (Cu), gold (Au), aluminum (Al), zinc (Zn), tin (Sn), some other conductive material, or a combination of the foregoing. In some embodiments, the first piezoelectric structure 128a may comprise, for example, lead zirconate titanate (PZT), zinc oxide (ZnO), barium titanate ($BaTiO_3$), potassium niobate ($KNbO_3$), sodium-tungsten-oxide ($Na_2WO_3$), barium-sodium-niobium-oxide ($Ba_2NaNb_5O_5$), lead-potassium-niobium-oxide ($Pb_2KNb_5O_{15}$), langasite ($La_3Ga_5SiO_{14}$), gallium phosphate ($GaPO_4$), lithium-niobium-oxide ($LiNbO_3$), lithium tantalate ($LiTaO_3$), some other piezoelectric material, or a combination of the foregoing. The first conductive structure 130a may comprise, for example, Pt, Ti, Cu, Au, Al, Zn, Sn, some other conductive material, or a combination of the foregoing. In some embodiments, the first electrode 126a and the first conductive structure 130a comprise a same material (e.g., Pt). In other embodiments, the first electrode 126a may comprise a different material than the first conductive structure 130a. In further embodiments, the upper conductive line 120 may be a multi-layered structure comprising a first layer (e.g., TiN), a second layer (e.g., AlCu) disposed over and on the first layer, and a third layer (e.g., TiN) disposed over and on the second layer.

The first electrode 126a is configured to receive a first voltage. In some embodiments, the first voltage is less than or equal to about 25 volts (V). More specifically, the first voltage may be between about 15 V and about 25 V. In some embodiments, the first conductive structure 130a is configured to be electrically floating (e.g., having a floating voltage). In other embodiments, the first conductive structure 130a is configured to receive a second voltage. In some embodiments, the second voltage may be less than or equal to about 5 V. In yet further embodiments, the movable mass 122 is configured to receive a third voltage. The third voltage may be less than or equal to about 5 V.

Because the piezoelectric anti-stiction structures 124 are disposed between the upper ILD structure 112 and the movable mass 122, the piezoelectric anti-stiction structures 124 may prevent/correct stiction. For example, if the movable mass 122 becomes stuck to the first piezoelectric anti-stiction structure 124a, the first voltage can be provided to the first electrode 126a. By providing the first voltage to the first electrode 126a, the first piezoelectric structure 128a may deform (or vibrate) from a first shape to a second shape different than the first shape due to a voltage across the first piezoelectric structure 128a, thereby generating a mechanical force that may be sufficient to correct (or prevent) a seized state (e.g., the movable mass 122 being stuck to the first piezoelectric anti-stiction structure 124a).

Figure 2:
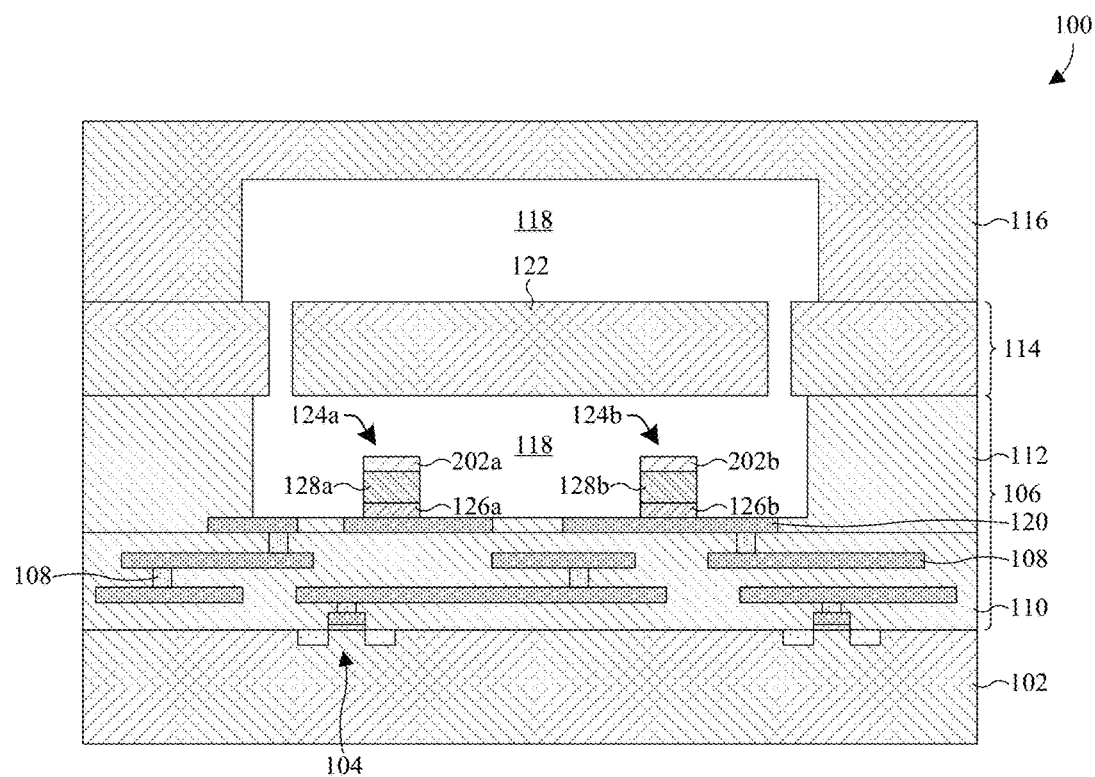
FIG. 2 illustrates a cross-sectional view of some other embodiments of the MEMS device of FIG. 1.

FIG. 2 illustrates a cross-sectional view of some other embodiments of the MEMS device 100 of FIG. 1.

As shown in FIG. 2, the piezoelectric anti-stiction structures 124 may comprise dielectric structures 202 disposed on the piezoelectric structures 128, respectively. For example, the first piezoelectric anti-stiction structure 124a may comprise a first dielectric structure 202a disposed on the first piezoelectric structure 128a, and the second piezoelectric anti-stiction structure 124b may comprise a second dielectric structure 202b disposed on a second piezoelectric structure 128b. The first dielectric structure 202a is separated from the upper ILD structure 112 by both the first piezoelectric structure 128a and the first electrode 126a. In some embodiments, the first dielectric structure 202a may comprise, for example, an oxide (e.g., $SiO_2$), a nitride (e.g., silicon nitride (SiN)), an oxy-nitride (e.g., silicon oxy-nitride ($SiO_xN_y$)), some other dielectric material, or a combination of the foregoing.

In embodiments in which the piezoelectric anti-stiction structures 124 comprise the dielectric structures 202, respectively, the movable mass 122 may have the first doping type and have the first doping concentration or have the second doping type and have the second doping concentration. In such embodiments, the piezoelectric anti-stiction structures 124 may prevent/correct stiction by providing the third voltage to the movable mass 122 and applying the first voltage to the first electrode 126a. In some embodiments, the third voltage and the first voltage may be applied whether the movable mass 122 is in a seized state (e.g., unable to freely move) or in movable state (e.g., normal operating state). By providing the first voltage to the first electrode 126a and the third voltage to the movable mass 122, a voltage across the first piezoelectric structure 128a will differ based on a distance in which the movable mass 122 is from the first electrode 126a. Accordingly, if the movable mass 122 deflects beyond a given point towards the first piezoelectric anti-stiction structure 124a (e.g., contacts/sticks to the first dielectric structure 202a), the voltage across the first piezoelectric structure 128a may be sufficient to cause the first piezoelectric structure 128a to deform, thereby generating a mechanical force that may be sufficient to correct (or prevent) a seized state. In further embodiments, the first doping concentration and/or the second doping concentration may be such that the voltage across the first piezoelectric structure 128a is not sufficient to deform the first piezoelectric structure 128a unless the movable mass 122 contacts/sticks to the first dielectric structure 202a.

Figure 3:
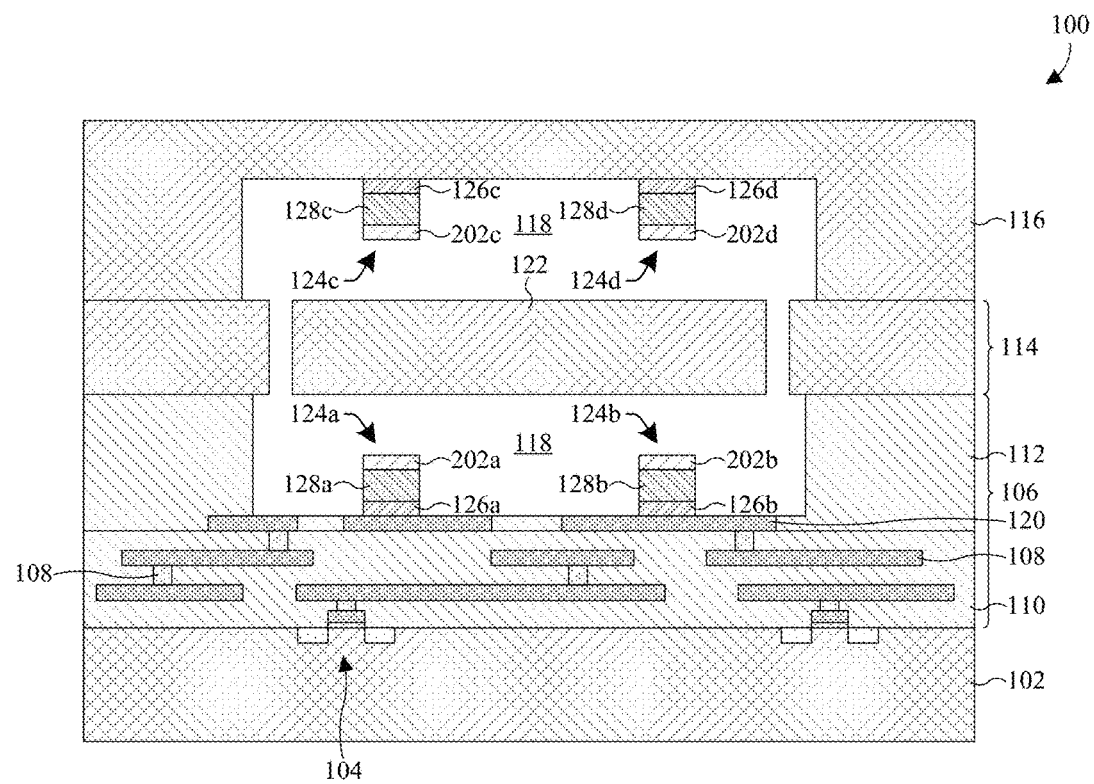
FIG. 3 illustrates a cross-sectional view of some other embodiments of the MEMS device of FIG. 1.

FIG. 3 illustrates a cross-sectional view of some other embodiments of the MEMS device 100 of FIG. 1.

As shown in FIG. 3, the piezoelectric anti-stiction structures 124 may be disposed between the movable mass 122 and the third semiconductor substrate 116. For example, a third piezoelectric anti-stiction structure 124c and a fourth piezoelectric anti-stiction structure 124d are disposed in the cavity 118 and between the movable mass 122 and a bottom surface of the third semiconductor substrate 116. Because the third piezoelectric anti-stiction structure 124c is disposed between the movable mass 122 and the third semiconductor substrate 116, the third piezoelectric anti-stiction structure 124c may prevent/correct stiction in which the movable mass 122 is stuck to a surface disposed above the movable mass 122 (e.g., the bottom surface of the third semiconductor substrate 116). In some embodiments, the piezoelectric anti-stiction structures 124 disposed between the movable mass 122 and the third semiconductor substrate 116 may be referred to as piezoelectric anti-stiction stoppers. In further embodiments, the piezoelectric anti-stiction structures 124 disposed between the movable mass 122 and the upper ILD structure 112 may be referred to as piezoelectric anti-stiction bumps.

In some embodiments, the third piezoelectric anti-stiction structure 124c comprises a third dielectric structure 202c disposed on a third piezoelectric structure 128c. The third dielectric structure 202c separates both the third piezoelectric structure 128c and a third electrode 126c from the movable mass 122. In further embodiments, the third electrode 126c may contact both the third semiconductor substrate 116 and the third piezoelectric structure 128c.

In some embodiments, the piezoelectric anti-stiction structures 124 disposed above the movable mass 122 may be aligned in a vertical direction with the piezoelectric anti-stiction structures 124 disposed below the movable mass 122, respectively. For example, the third piezoelectric anti-stiction structure 124c may be vertically aligned with the first piezoelectric anti-stiction structure 124a. In other embodiments, the piezoelectric anti-stiction structures 124 disposed above the movable mass 122 may not be aligned with the piezoelectric anti-stiction structures 124 disposed below the movable mass 122, respectively. For example, the third piezoelectric anti-stiction structure 124c may be spaced a first lateral distance from a sidewall of the upper ILD structure 112, and the first piezoelectric anti-stiction structure 124a may be spaced a second lateral distance from the sidewall of the upper ILD structure 112 different than the first lateral distance.

Figure 4:
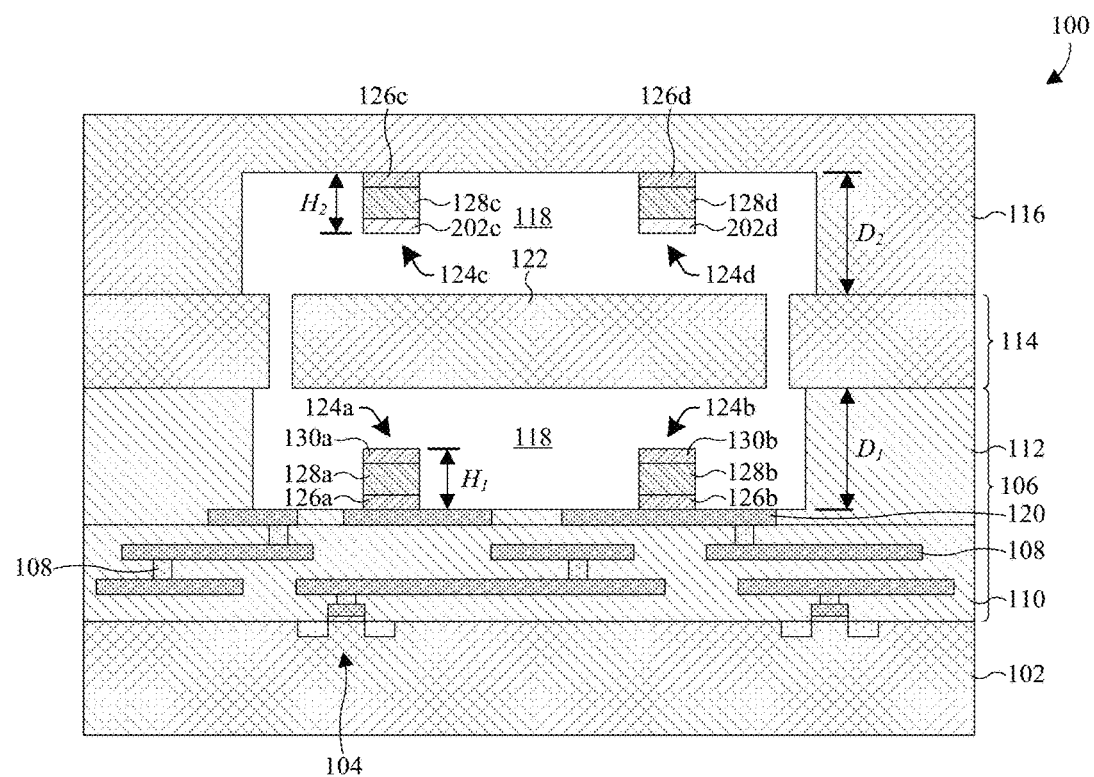
FIG. 4 illustrates a cross-sectional view of some other embodiments of the MEMS device of FIG. 1.

FIG. 4 illustrates a cross-sectional view of some other embodiments of the MEMS device 100 of FIG. 1.

As shown in FIG. 4, some of the piezoelectric anti-stiction structures 124 may comprise the dielectric structures 202 and some other of the piezoelectric anti-stiction structures 124 may comprise the conductive structures 130. For example, the first piezoelectric anti-stiction structure 124a may comprise the first conductive structure 130a, and the third piezoelectric anti-stiction structure 124c may comprise the third dielectric structure 202c.

In some embodiments, a layout of the first piezoelectric anti-stiction structure 124a may be generally square shaped, rectangular shaped, or the like. In some embodiments, sidewalls of the first piezoelectric anti-stiction structure 124a may be substantially vertical. In other embodiments, the sidewalls of the first piezoelectric anti-stiction structure 124a may be angled (e.g., angled inward as they extend from the upper surface of the upper ILD structure 112). In further embodiments, sidewalls of the first electrode 126a may be substantially aligned with sidewalls of the first piezoelectric structure 128a. The sidewalls of the first piezoelectric structure 128a may be substantially aligned with sidewalls of the first conductive structure 130a. In yet further embodiments, sidewalls of the third piezoelectric structure 128c may be substantially aligned with sidewalls of the third dielectric structure 202c.

The upper surface of the upper ILD structure 112 (e.g., bottom of the cavity 118) is vertically spaced from an uppermost surface of the upper ILD structure 112 by a first distance $D_1$. The first piezoelectric anti-stiction structure 124a has a first height $H_1$. In some embodiments, the first height $H_1$ is between about 30 percent and about 50 percent of the first distance $D_1$. In further embodiments, the first distance $D_1$ is less than or equal to about 3 micrometers (um). More specifically, the first distance $D_1$ may be between about 2 um and 3 um. In yet further embodiments, the first height $H_1$ is less than or equal to about 1.5 um. More specifically, the first height $H_1$ is about 1 um.

The bottom surface of the third semiconductor substrate 116 (e.g., top of the cavity 118) is vertically spaced from a bottommost surface of the third semiconductor substrate 116 by a second distance $D_2$. The third piezoelectric anti-stiction structure 124c has a second height $H_2$. In some embodiments, the second height $H_2$ is between about 30 percent and about 50 percent of the second distance $D_2$. The second distance $D_2$ may be less than or equal to about 3 um. More specifically, the second distance $D_2$ may be between about 2 um and 3 um. The second height $H_2$ may be less than or equal to about 1.5 um. More specifically, the second height $H_2$ may be about 1 um.

In some embodiments, the first height $H_1$ may be substantially the same as the second height $H_2$. In other embodiments, the first height $H_1$ may be different than the second height $H_2$. In further embodiments, the first distance $D_1$ may be substantially the same as the second distance $D_2$. In other embodiments, the first distance $D_1$ may be different than the second distance $D_2$.

In some embodiments, a length (and/or width) of each the piezoelectric anti-stiction structures 124 may be substantially the same. In other embodiments, the length (and/or width) of some of the piezoelectric anti-stiction structures 124 may be different than the length (and/or width) of some other of the piezoelectric anti-stiction structures 124. In further embodiments, a length of the first piezoelectric anti-stiction structure 124a may be between about 15 percent and about 50 percent of the first distance $D_1$. More specifically, the length of the first piezoelectric anti-stiction structure 124a may be between about 0.5 um and about 1 um. In yet further embodiments, a width of the first piezoelectric anti-stiction structure 124a may be between about 15 percent and about 50 percent of the first distance $D_1$. More specifically, the width of the first piezoelectric anti-stiction structure 124a may be between about 0.5 um and about 1 um.

In some embodiments, a length of the third piezoelectric anti-stiction structure 124c may be between about 15 percent and about 50 percent of the second distance $D_2$. More specifically, the length of the third piezoelectric anti-stiction structure 124c may be between about 0.5 um and about 1 um. In further embodiments, a width of the third piezoelectric anti-stiction structure 124c may be between about 15 percent and about 50 percent of the second distance $D_2$. More specifically, the width of the third piezoelectric anti-stiction structure 124c may be between about 0.5 um and about 1 um.

Figure 5:
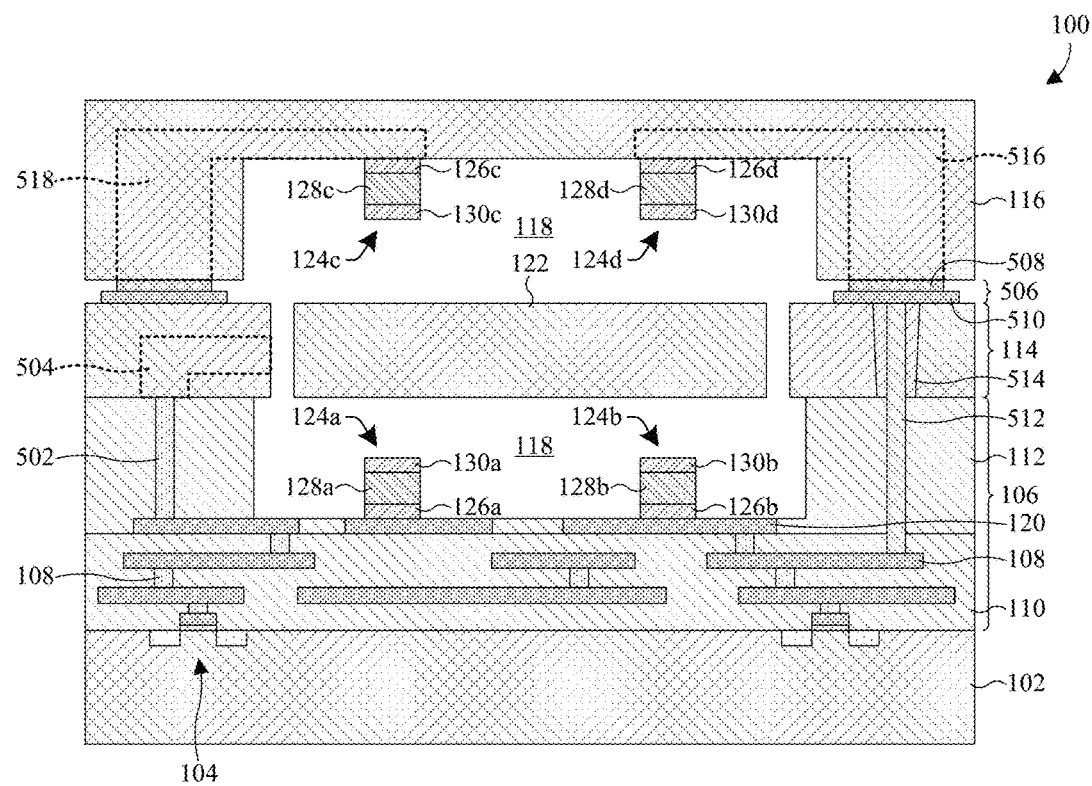
FIG. 5 illustrates a cross-sectional view of some more detailed embodiments of the MEMS device of FIG. 1.

FIG. 5 illustrates a cross-sectional view of some more detailed embodiments of the MEMS device 100 of FIG. 1.

As shown in FIG. 5, an upper conductive via 502 (e.g., a metal via) is disposed in the upper ILD structure 112. In some embodiments, the upper conductive via 502 is disposed in the both the upper ILD structure 112 and the lower ILD structure 110. The upper conductive via 502 is electrically coupled to the interconnect structure 108 and the second semiconductor substrate 114. In further embodiments, the upper conductive via 502 may comprise, for example, Cu, Al, W, or the like.

A first conductive channel 504 is disposed in the second semiconductor substrate 114 and provides an electrical connection between the upper conductive via 502 and the movable mass 122. The first conductive channel 504 is a portion of the second semiconductor substrate 114 having the first doping type or the second doping type. In some embodiments, the third voltage may be applied to the movable mass 122 via the interconnect structure 108, the upper conductive via 502, and the first conductive channel 504. In further embodiments, the third voltage may be applied to the movable mass 122 because the movable mass 122 has a same doping type as the first conductive channel 504. In further embodiments, the first conductive channel 504 may extend from a fixed portion of the second semiconductor substrate 114, along one or more of the tethers (not shown), and to a region of the movable mass 122 having the first doping type or the second doping type. In yet further embodiments, the first conductive channel 504 may be referred to as a first doped region.

In some embodiments, the third semiconductor substrate 116 is bonded to the second semiconductor substrate 114 via a bond structure 506 (e.g., a eutectic bond structure). The bond structure 506 may comprise an upper bond ring 508 disposed on a lower bond ring 510. In some embodiments, the bond structure 506 is electrically conductive. In further embodiments, the lower bond ring 510 may comprise, for example, Cu, Al, Au, Sn, Ti, some other bonding material, or a combination of the foregoing. In further embodiments, the upper bond ring 508 may comprise, for example, Cu, Al, Au, Sn, Ge, some other bonding material, or a combination of the foregoing. The upper bond ring 508 may have a ring-shaped top layout that continuously extends around the movable mass 122. In yet further embodiments, the lower bond ring 510 may have a ring-shaped top layout that continuously extends around the movable mass 122.

A through-substrate via (TSV) 512 is disposed in the second semiconductor substrate 114, the upper ILD structure 112, and the lower ILD structure 110. In some embodiments, the TSV 512 is disposed over the lower ILD structure 110. The TSV 512 extends completely through the second semiconductor substrate 114 to electrically couple the interconnect structure 108 to the bond structure 506. In further embodiments, the TSV 512 extends through an isolation structure 514 (e.g., shallow trench isolation (STI) structure) disposed in the second semiconductor substrate 114. In yet further embodiments, the TSV 512 may comprise, for example, Cu, Al, W, or the like.

A second conductive channel 516 is disposed in the third semiconductor substrate 116 and provides an electrical connection between the bond structure 506 and a fourth electrode 126d. The second conductive channel 516 is a portion of the third semiconductor substrate 116 having the first doping type or the second doping type. In some embodiments, the first voltage may be applied to the fourth electrode 126d via the interconnect structure 108, the TSV 512, the bond structure 506, and the second conductive channel 516. In further embodiments, the second conductive channel 516 may be referred to as a second doped region.

A third conductive channel 518 is disposed in the third semiconductor substrate 116 and provides an electrical connection between the bond structure 506 and the third electrode 126c. The third conductive channel 518 is a portion of the third semiconductor substrate 116 having the first doping type or the second doping type. In some embodiments, the first voltage may be applied to the third electrode 126c via the interconnect structure 108, the TSV 512 (or another TSV), the bond structure 506, and the third conductive channel 518. In further embodiments, the third conductive channel 518 may be referred to as a third doped region.

Figure 6:
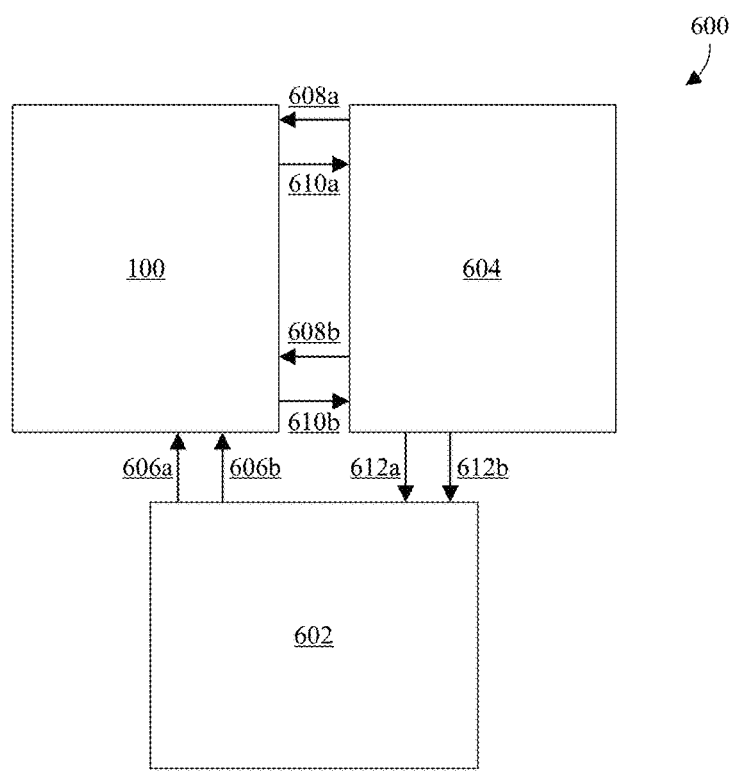
FIG. 6 illustrates a view of some embodiments of a system comprising some embodiments of the MEMS device of FIG. 1.

FIG. 6 illustrates a view of some embodiments of a system 600 comprising some embodiments of the MEMS device 100 of FIG. 1.

As shown in FIG. 6, the system 600 comprises the MEMS device 100 and bias circuitry 602. The bias circuitry 602 is electrically coupled to the MEMS device 100. The bias circuitry 602 is configured to provide one or more bias signals 606 to the MEMS device 100 to prevent/correct stiction of the movable mass 122 of the MEMS device 100 (see, e.g., FIG. 5). For example, the bias circuitry 602 may provide a first bias signal 606a having the first voltage to the electrodes 126 of the piezoelectric anti-stiction structures 124, and the bias circuitry 602 may provide a second bias signal 606b having the third voltage to the movable mass 122.

In some embodiments, during operation of the MEMS device 100, the bias circuitry 602 may continuously provide the one or more bias signals 606 to the MEMS device 100. In other embodiments, the bias circuitry 602 may selectively provide the one or more bias signals 606 to the MEMS device 100. In further embodiments, the bias circuitry 602 may selectively provide the one or more bias signals 606 to the electrodes 126 of the piezoelectric anti-stiction structures 124. For example, in some embodiments, the bias circuitry 602 may provide only the first bias signal 606a to the first electrode 126a.

In some embodiments, the system 600 comprises measurement circuitry 604 that is electrically coupled to the MEMS device 100. In further embodiments, the measurement circuitry 604 is electrically coupled to the bias circuitry 602. The measurement circuitry 604 is configured to determine whether the MEMS device 100 is in a movable state (e.g., the movable mass 122 is free to move about the cavity 118) or in a seized state (e.g., the movable mass 122 is unable to move freely about the cavity 118). For example, the measurement circuitry 604 may provide one or more analysis signals 608 to the MEMS device 100. The measurement circuitry 604 receives one or more response signals 610 that correspond to the one or more analysis signals 608. For example, the measurement circuitry 604 may provide a first analysis signal 608a and a second analysis signal 608b and receive a first response signal 610a and a second response signal 610b, respectively. The measurement circuitry analyzes the one or more response signals 610 to determine whether the movable mass 122 is in the movable state or the seized state (e.g., analyzing voltages to determine the location of the movable mass 122 in the cavity 118 in relation to one or more fixed electrodes).

The measurement circuitry 604 may determine the MEMS device 100 is in a first seized state or a second seized state. The first seized state may be referred to as a touch-down state and result when the movable mass 122 contacts/sticks to the first piezoelectric anti-stiction structure 124a and the second piezoelectric anti-stiction structure 124b. The second seized state may be referred to a tilt state and result when the movable mass 122 contacts/sticks to the first piezoelectric anti-stiction structure 124a but not the second piezoelectric anti-stiction structure 124b, or vice versa. In some embodiments, the measurement circuitry 604 may determine the movable mass 122 is in the first seized state when both the first response signal 610a and the second response signal 610b indicate the movable mass 122 is stuck to both the first piezoelectric anti-stiction structure 124a and the second piezoelectric anti-stiction structure 124b. In further embodiments, the measurement circuitry 604 may determine the movable mass 122 is in the second seized state when the first response signal 610a indicates the movable mass 122 is stuck to the first piezoelectric anti-stiction structure 124a, but the second response signal 610b indicates the movable mass 122 is not stuck to the second piezoelectric anti-stiction structure 124b.

In some embodiments, the measurement circuitry 604 may provide one or more state indicating signals 612 that are based on the state of the MEMS device 100 to the bias circuitry 602. Based on the one or more state indicating signals 612, the bias circuitry 602 may (or may not) provide the one or more bias signals 606 to the MEMS device 100. For example, the measurement circuitry 604 may provide one or more state indicating signals 612 that indicate the MEMS device is in the movable state, and the bias circuitry 602 may not provide any of the one or more bias signals 606 to the MEMS device 100. In other embodiments, during operation of the MEMS device 100, the bias circuitry 602 continuously provides the one or more bias signals 606 to the MEMS device 100.

In some embodiments, the measurement circuitry 604 may provide a first state indicating signal 612a and a second state indicating signal 612b to the bias circuitry 602 indicating the MEMS device 100 is in the first seized state, and the bias circuitry 602 may provide the one or more bias signals 606 to the MEMS device 100. In such embodiments, the one or more bias signals 606 may be provided to one or more of the electrodes 126 of the piezoelectric anti-stiction structures 124. In other embodiments, the measurement circuitry 604 may provide the first state indicating signal 612a and the second state indicating signal 612b to the bias circuitry 602 to indicate the MEMS device 100 is in the second seized state. For example, the first state indicating signal 612a may indicate the movable mass 122 is stuck to the first piezoelectric anti-stiction structure 124a, and the second state indicating signal 612b may indicate the movable mass 122 is not stuck to the second piezoelectric anti-stiction structure 124b. In such embodiments, the bias circuitry 602 may provide a corresponding one or more bias signals 606 to the MEMS device 100. For example, the bias circuitry 602 may provide the first bias signal 606a to the first electrode 126a to deform the first piezoelectric structure 128a. In other such embodiments, the bias circuitry 602 may provide the one or more bias signals 606 to the MEMS device 100. For example, the bias circuitry 602 may provide the first bias signal 606a to the first electrode 126a to deform the first piezoelectric structure 128a and the second bias signal 606b to the second electrode 126b to deform the second piezoelectric structure 128b.

In some embodiments, an integrated chip (IC) comprises the system 600. In other embodiments, a first IC may comprise the MEMS device 100, and a second IC different than the first IC may comprise the bias circuitry 602 and/or the measurement circuitry 604. In yet other embodiments, the first IC may comprise the MEMS device 100, the second IC may comprise the bias circuitry 602, and a third IC different than the first IC and the second IC may comprise the measurement circuitry 604. In some embodiments, the bias circuitry 602 comprises one or more of the one or more semiconductor devices 104 (see, e.g., FIG. 5). In further embodiments, the measurement circuitry 604 comprises one or more of the one or more semiconductor devices 104. In yet further embodiments, the bias circuitry 602 and the measurement circuitry 604 may be disposed on/over a same semiconductor substrate (e.g., the first semiconductor substrate 102).

FIGS. 7-22 illustrate a series of cross-sectional views of some embodiments for forming the MEMS device 100 of FIG. 5.

Figure 7:
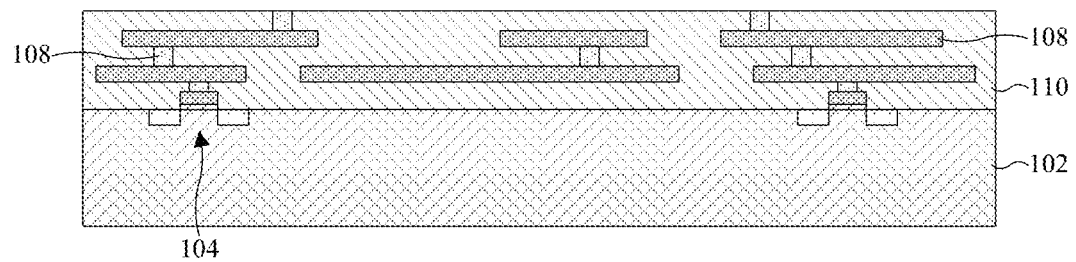
FIGS. 7-22 illustrate a series of cross-sectional views of some embodiments for forming the MEMS device of FIG. 5.

As shown in FIG. 7, a portion of an interconnect structure 108 is disposed in a lower ILD structure 110 and over a first semiconductor substrate 102. Further, one or more semiconductor devices 104 are disposed on/in the first semiconductor substrate 102. In some embodiments, a method for forming the structure illustrated in FIG. 7 comprises forming the one or more semiconductor devices 104 by forming pairs of source/drain regions in the first semiconductor substrate 102 (e.g., via ion implantation). Thereafter, gate dielectrics and gate electrodes are formed over the first semiconductor substrate and between the pairs of source/drain regions (e.g., via deposition/growth processes and etching processes). A first ILD layer is then formed over the one or more semiconductor devices 104, and contact openings are formed in the first ILD. A conductive material (e.g., W) is formed on the first ILD layer and in the contact openings. Thereafter, a planarization process (e.g., chemical-mechanical polishing (CMP)) is performed into the conductive material to form conductive contacts (e.g., metal contacts) in the first ILD layer.

A second ILD layer is then formed over the first ILD layer and the conductive contacts, and first conductive line trenches are formed in the second ILD layer. A conductive material (e.g., Cu) is formed on the second ILD layer and in the first conductive line trenches. Thereafter, a planarization process (e.g., CMP) is performed into the conductive material to form a conductive line (e.g., metal 1) in the second ILD. A third ILD layer is then formed over the second ILD layer and the conductive line, and conductive via openings are formed in the third ILD layer. A conductive material (e.g., Cu) is formed on the third ILD layer and in the conductive via openings. Thereafter, a planarization process (e.g., (CMP) is performed into the conductive material to form conductive vias (e.g., metal vias) in the third ILD. The above processes for forming the conductive line and the conductive vias may be repeated any number of times. In some embodiments, the above layers and/or structures may be formed using a deposition or growth process such as, for example, chemical vapor deposition (CVD), physical vapor deposition (PVD), atomic layer deposition (ALD), thermal oxidation, sputtering, electrochemical plating, electroless plating, some other deposition or growth process, or a combination of the foregoing.

Figure 8:
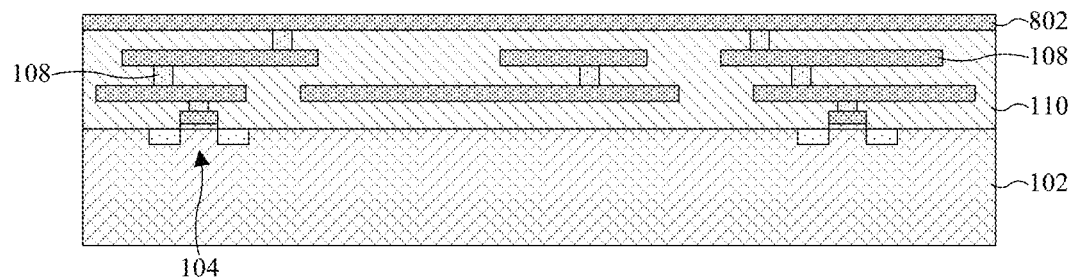

As shown in FIG. 8, a first conductive layer 802 is formed over the lower ILD structure 110 and the portion of the interconnect structure 108. In some embodiments, a process for forming the first conductive layer 802 comprises depositing the first conductive layer 802 on the lower ILD structure 110 and the portion of the interconnect structure 108. The first conductive layer 802 may be deposited by, for example, CVD, PVD, ALD, sputtering, electrochemical plating, electroless plating, some other deposition process, or a combination of the foregoing. In further embodiments, the first conductive layer 802 may comprise, for example, Cu, Al, TiN, AlCu, some other conductive material, or a combination of the foregoing.

In some embodiments, the first conductive layer 802 comprises multiple layers. For example, the first conductive layer may comprise a first layer (e.g., TiN), a second layer (e.g., AlCu) disposed over and on the first layer, and a third layer (e.g., TiN) disposed over and on the second layer. In such embodiments, a process for forming the first conductive layer 802 may comprise depositing the first layer on the lower ILD structure 110 and the portion of the interconnect structure 108, the second layer on the first layer, and the third layer on the second layer.

Figure 9:
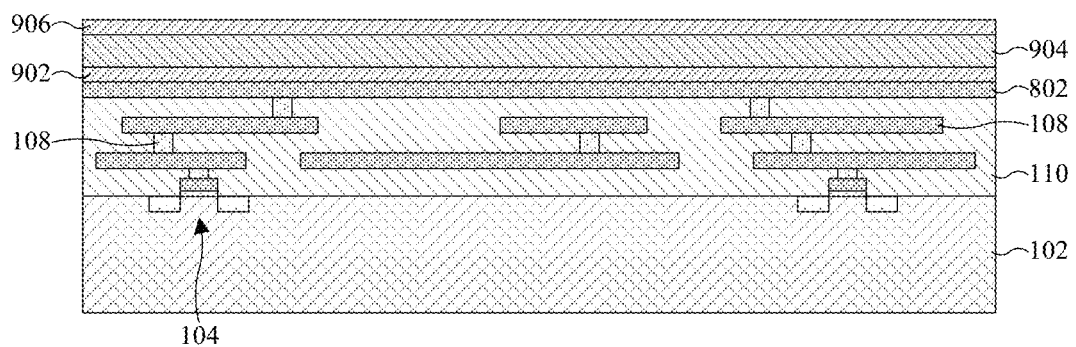

As shown in FIG. 9, a second conductive layer 902 is formed over the first conductive layer 802. In some embodiments, a process for forming the second conductive layer 902 comprises depositing the second conductive layer 902 on the first conductive layer 802. The second conductive layer 902 may be deposited by, for example, CVD, PVD, ALD, sputtering, electrochemical plating, electroless plating, some other deposition process, or a combination of the foregoing. In further embodiments, the second conductive layer 902 may comprise, for example, Pt, Ti, Cu, Au, Al, Zn, Sn, Ru, some other conductive material, or a combination of the foregoing.

Also shown in FIG. 9, a first piezoelectric layer 904 is formed over the second conductive layer 902. In some embodiments, a process for forming the first piezoelectric layer 904 comprises depositing the first piezoelectric layer 904 on the second conductive layer 902. The first piezoelectric layer 904 may be deposited or grown by, for example, sputtering, a spin-on process, CVD, PVD, ALD, molecular-beam epitaxy, some other deposition or growth process, or a combination of the foregoing. In further embodiments, the first piezoelectric layer 904 may comprise, for example, PZT, ZnO, $BaTiO_3$, $KNbO_3$, $Na_2WO_3$, $Ba_2NaNb_5O_5$, $Pb_2KNb_5O_{15}$, $La_3Ga_5SiO_{14}$, $GaPO_4$, $LiNbO_3$, $LiTaO_3$, some other piezoelectric material, or a combination of the foregoing.

Also shown in FIG. 9, a third conductive layer 906 is formed over the first piezoelectric layer 904. In some embodiments, a process for forming the third conductive layer 906 comprises depositing the third conductive layer 906 on the first piezoelectric layer 904. The third conductive layer 906 may be deposited by, for example, CVD, PVD, ALD, sputtering, electrochemical plating, electroless plating, some other deposition process, or a combination of the foregoing. In further embodiments, the third conductive layer 906 may comprise, for example, Pt, Ti, Cu, Au, Al, Zn, Sn, Ru, some other conductive material, or a combination of the foregoing. In embodiments in which the dielectric structures 202 are disposed on the piezoelectric structures 128, respectively, the third conductive layer 906 may not be formed over the first piezoelectric layer 904.

Figure 10:
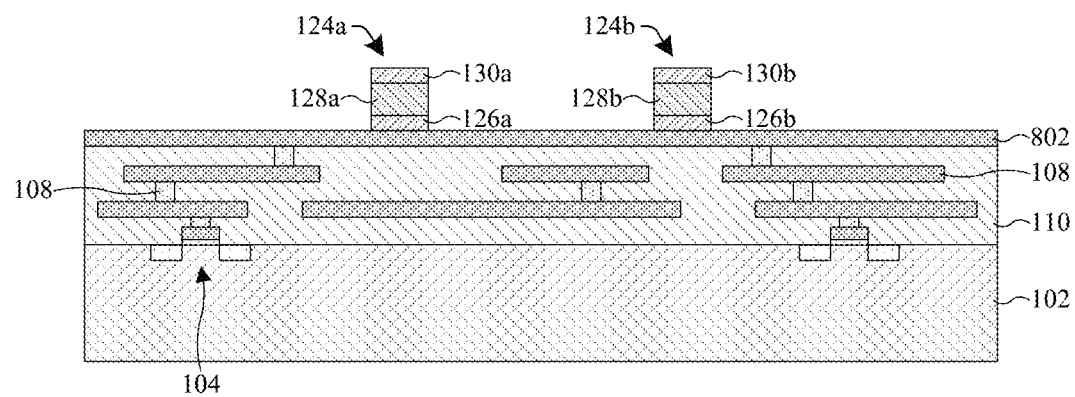

As shown in FIG. 10, a first plurality of piezoelectric anti-stiction structures 124 are formed over the first conductive layer 802. In some embodiments, a process for forming the piezoelectric anti-stiction structures 124 comprises forming a masking layer (not shown) (e.g., a positive/negative photoresist) on the third conductive layer 906 (see, e.g., FIG. 9). Thereafter, the third conductive layer 906, the first piezoelectric layer 904, and the second conductive layer 902 (see, e.g., FIG. 9) are exposed to an etchant (e.g., a wet/dry etchant). The etchant removes unmasked portions of the third conductive layer 906, thereby forming a plurality of conductive structures 130 on the first piezoelectric layer 904; unmasked portions of the first piezoelectric layer 904, thereby forming a plurality of piezoelectric structures 128 on the second conductive layer 902; and unmasked portions of the second conductive layer 902, thereby forming a plurality of electrodes 126 on the first conductive layer 802. Subsequently, the masking layer may be stripped away. It will be appreciated that one or more etchants and/or masking layers may be utilized to form the piezoelectric anti-stiction structures 124.

Figure 11:
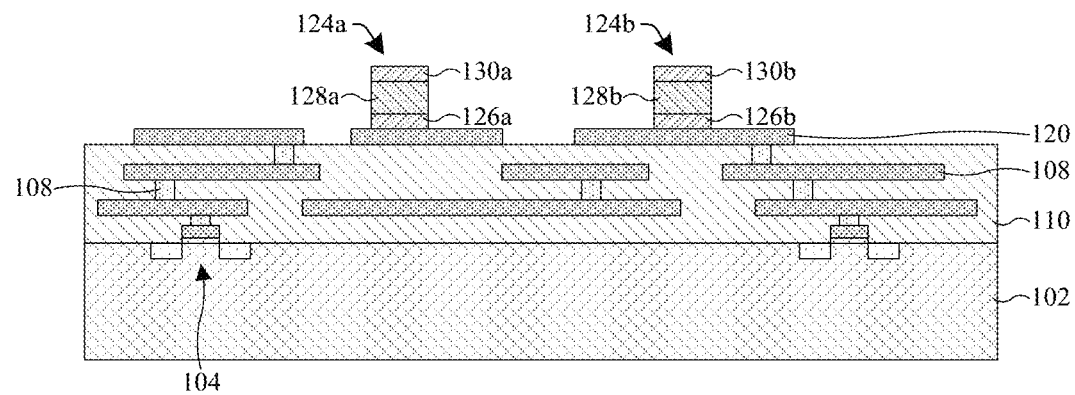

As shown in FIG. 11, an upper conductive line 120 of the interconnect structure 108 is formed. In some embodiments, a process for forming the upper conductive line 120 comprises forming a masking layer (not shown) on the first conductive layer 802 and covering the piezoelectric anti-stiction structures 124 (see, e.g., FIG. 10). Thereafter, the first conductive layer 802 is exposed to an etchant. The etchant removes unmasked portions of the first conductive layer 802, thereby forming the upper conductive line 120. Subsequently, the masking layer may be stripped away.

Figure 12:
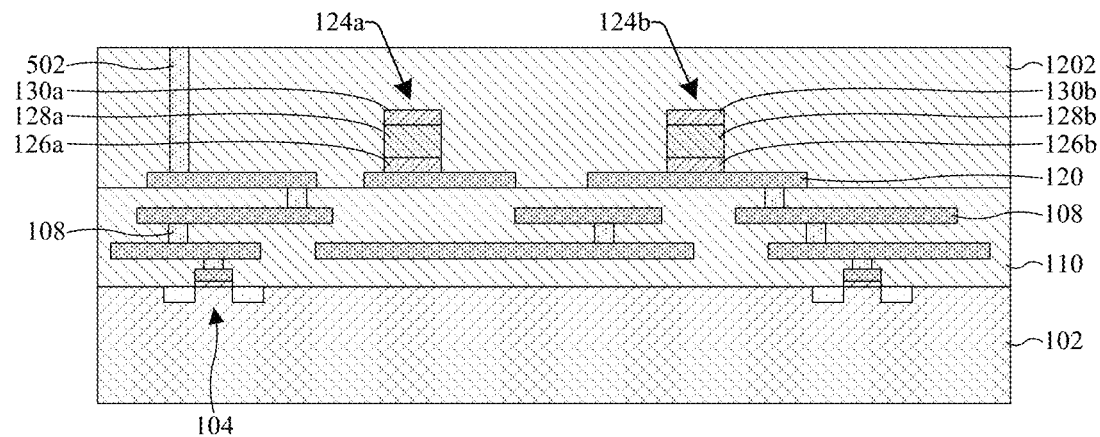

As shown in FIG. 12, an upper ILD layer 1202 is formed over the upper conductive line 120 and over the piezoelectric anti-stiction structures 124. The upper ILD layer 1202 may be formed with a substantially planar upper surface. In some embodiments, a process for forming the upper ILD layer 1202 comprises depositing the upper ILD layer 1202 on the upper conductive line 120 and the piezoelectric anti-stiction structures 124. The upper ILD layer 1202 may be deposited by, for example, CVD, PVD, ALD, sputtering, some other deposition process, or a combination of the foregoing. In further embodiments, a planarization process (e.g., CMP) may be performed into the upper ILD layer 1202 to planarize the upper surface of the upper ILD layer 1202. The upper ILD layer 1202 may comprise a low-k dielectric, (e.g., a dielectric material with a dielectric constant less than about 3.9), an oxide (e.g., $SiO_2$), or the like. It will be appreciated that, in some embodiments, the upper ILD layer 1202 may comprise one or more stacked ILD layers, which may respectively comprise a low-k dielectric, an oxide, or the like.

Also shown in FIG. 12, an upper conductive via 502 is formed in the upper ILD layer 1202. The upper conductive via 502 is formed extending through the upper ILD layer 1202 to the upper conductive line 120. In some embodiments, a process for forming the upper conductive via 502 comprises forming a masking layer (not shown) on the upper ILD layer 1202. Thereafter, the upper ILD layer 1202 is exposed to an etchant to remove unmasked portions of the upper ILD layer 1202, thereby forming an opening (not shown) in the upper ILD layer 1202. A conductive layer (not shown) is then deposited on the upper ILD layer 1202 and in the opening. In some embodiments, the conductive layer comprises, for example, Cu, Al, W, or the like. In further embodiments, the conductive layer may be deposited by, for example, CVD, PVD, ALD, sputtering, electrochemical plating, electroless plating, some other deposition process, or a combination of the foregoing. Thereafter, a planarization process (e.g., CMP) is performed into the conductive layer, thereby forming the upper conductive via 502.

Figure 13:
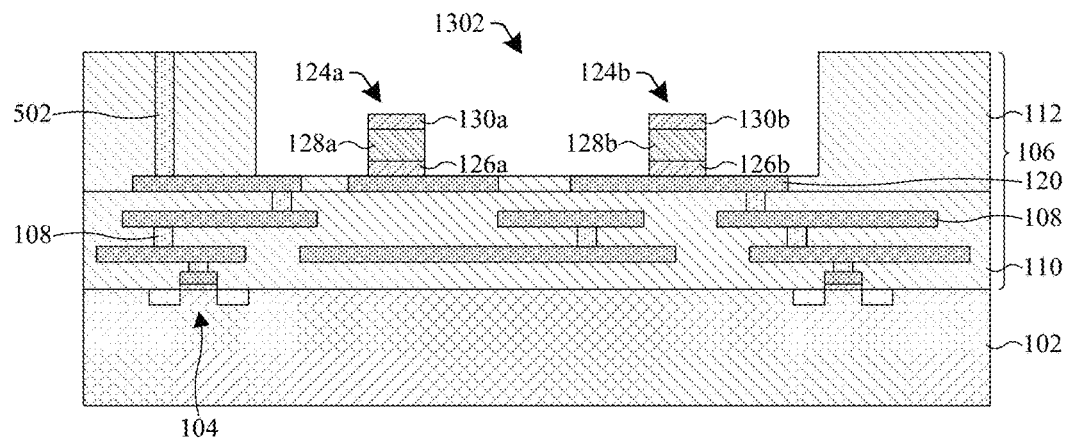

As shown in FIG. 13, an upper ILD structure 112 is formed over the lower ILD structure 110. In some embodiments, a process for forming the upper ILD structure 112 comprises forming a first opening 1302 in the upper ILD layer 1202 that exposes the piezoelectric anti-stiction structures 124. In some embodiments, a process for forming the first opening 1302 comprises forming a masking layer (not shown) on the upper ILD layer 1202 and the upper conductive via 502. Thereafter, the upper ILD layer 1202 is exposed to an etchant to remove unmasked portions of the upper ILD layer 1202, thereby forming the first opening 1302. In further embodiments, formation of the upper ILD structure 112 completes formation of an ILD structure 106.

In embodiments in which the dielectric structures 202 are disposed on the piezoelectric structures 128, respectively, the dielectric structures 202 may be formed during or after formation of the upper ILD structure 112. For example, the dielectric structures 202 may be formed during formation of the upper ILD structure 112 by selectively forming the first opening 1302 (e.g., via multiple masking layers and etch processes), so that portions of the upper ILD layer 1202 remain on the piezoelectric structures 128, respectively, as the dielectric structures 202. In another example, the dielectric structures 202 may be formed after formation of the upper ILD structure 112 by depositing a dielectric layer onto the exposed piezoelectric structures 128, and selectively etching the dielectric layer to form the dielectric structures 202 on the piezoelectric structures 128, respectively.

Figure 14:
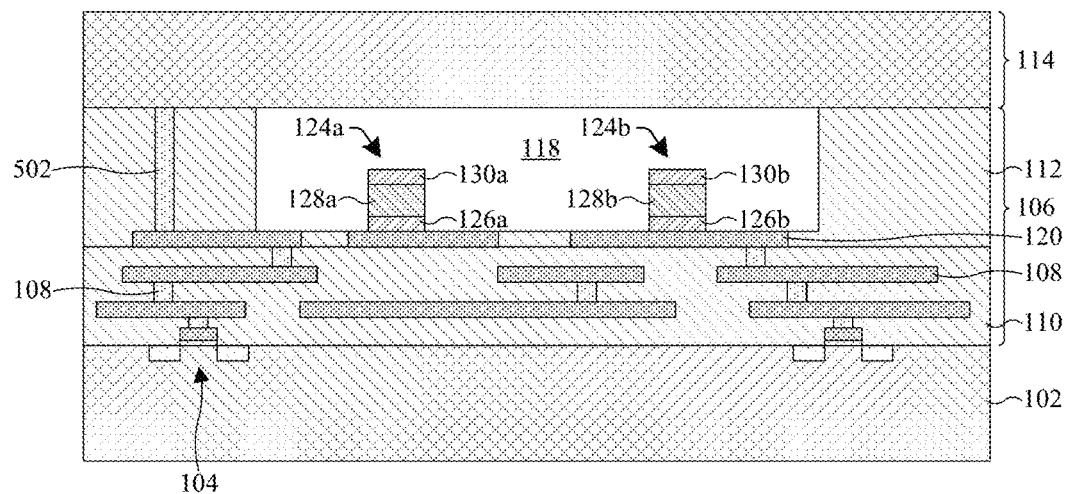

As shown in FIG. 14, a second semiconductor substrate 114 is bonded to the upper ILD structure 112. In some embodiments, bonding the second semiconductor substrate 114 to the upper ILD structure 112 forms a first lower portion of a cavity 118. In further embodiments, the second semiconductor substrate 114 may be bonded to the upper ILD structure 112 by, for example, direct bonding, hybrid bonding, eutectic bonding, or some other boning process. In yet further embodiments, after the second semiconductor substrate 114 is bonded to the upper ILD structure 112, the second semiconductor substrate 114 may be thinned down by removing (e.g., via grinding or CMP) an upper portion of the second semiconductor substrate 114.

Figure 15:
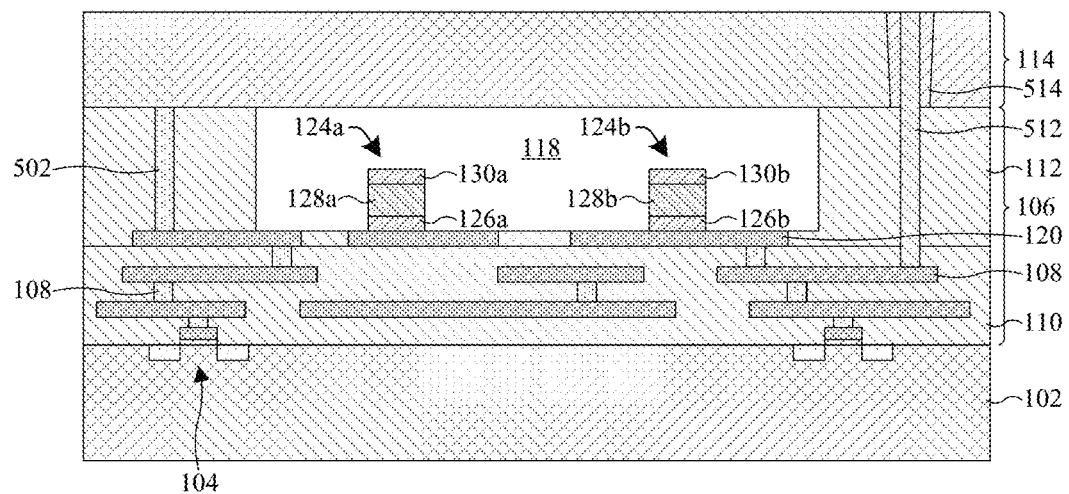

As shown in FIG. 15, a through-substrate via (TSV) 512 is formed extending through the second semiconductor substrate 114 to the interconnect structure 108. In some embodiments, the TSV 512 is formed extending through the second semiconductor substrate 114, the upper ILD structure 112, and at least a portion of the lower ILD structure 110. The TSV 512 may be formed extending through an isolation structure 514 disposed in the second semiconductor substrate 114. In some embodiments, the isolation structure 514 is formed prior to the TSV 512. In further embodiments, the isolation structure 514 may be formed by forming a trench in the second semiconductor substrate 114 and then filling the trench with a dielectric material. In yet further embodiments, a planarization process (e.g., CMP) may be performed into the dielectric material.

In some embodiments, a process for forming the TSV 512 comprises forming a masking layer (not shown) on the second semiconductor substrate 114. Thereafter, the second semiconductor substrate 114 is exposed to an etchant that removes unmasked portions of the second semiconductor substrate 114 and underlying portions of the upper ILD structure 112 and lower ILD structure 110, thereby forming a TSV opening that extends through the second semiconductor substrate 114 to the interconnect structure 108. After the TSV opening is formed, a conductive layer (not shown) is deposited on the second semiconductor substrate 114 and in the TSV opening. In some embodiments, the conductive layer comprises, for example, Cu, Al, W, or the like. In further embodiments, the conductive layer may be deposited by, for example, CVD, PVD, ALD, sputtering, electrochemical plating, electroless plating, some other deposition process, or a combination of the foregoing. Thereafter, a planarization process (e.g., CMP) is performed into the conductive layer, thereby forming the TSV 512. It will be appreciated that, in some embodiments, the TSV 512 may be one of multiple TSVs formed by the above process.

Figure 16:
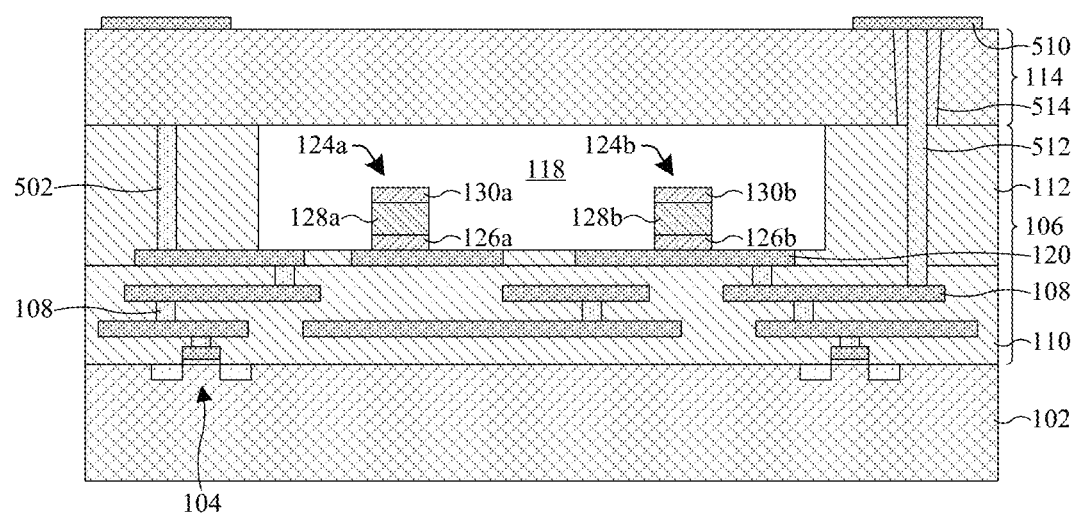

As shown in FIG. 16, a lower bond ring 510 is formed on the second semiconductor substrate 114 and the TSV 512. In some embodiments, a process for forming the lower bond ring 510 comprises forming a masking layer (not shown) over the second semiconductor substrate 114 and the TSV 512. The masking layer comprises a plurality of openings that expose portions of the second semiconductor substrate 114 and the TSV 512. A conductive layer (not shown) is then deposited on the masking layer and in the plurality of openings. In some embodiments, the conductive layer comprises, for example, Cu, Al, Au, Sn, some other bonding material, or a combination of the foregoing. In further embodiments, the conductive layer may be deposited by, for example, CVD, PVD, ALD, sputtering, electrochemical plating, electroless plating, some other deposition process, or a combination of the foregoing. Thereafter, a planarization process (e.g., CMP) is performed into the conductive layer, thereby forming the lower bond ring 510. Subsequently, in some embodiments, the masking layer is stripped away.

Figure 17:
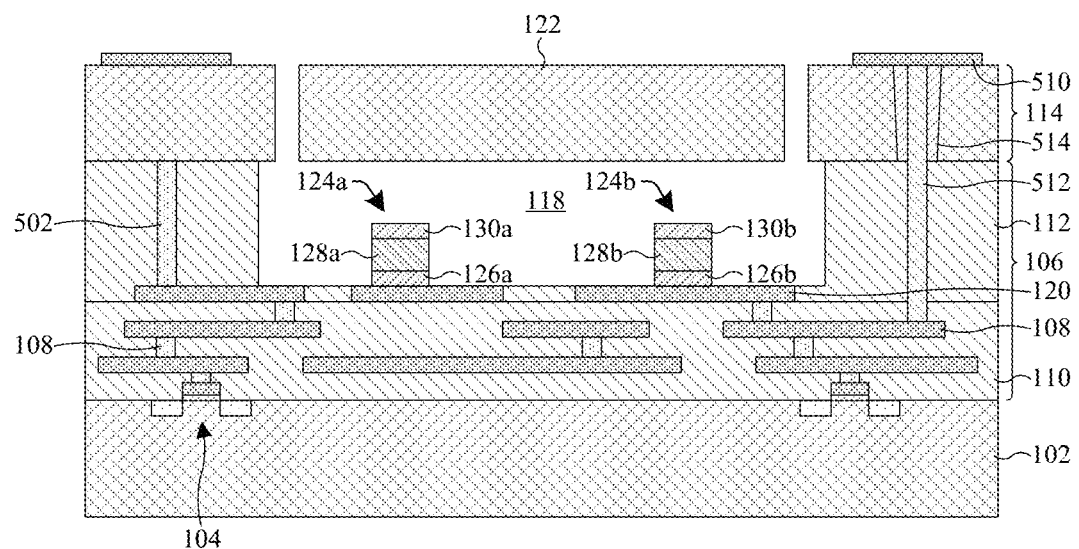

As shown in FIG. 17, a movable mass 122 is formed in the second semiconductor substrate 114. In some embodiments, a process for forming the movable mass 122 comprises forming a masking layer (not shown) on the second semiconductor substrate 114 and the lower bond ring 510. Thereafter, the second semiconductor substrate 114 is exposed to an etchant. The etchant removes unmasked portion(s) of the second semiconductor substrate 114, thereby forming the movable mass 122. Subsequently, in some embodiments, the masking layer is stripped away.

Figure 18:
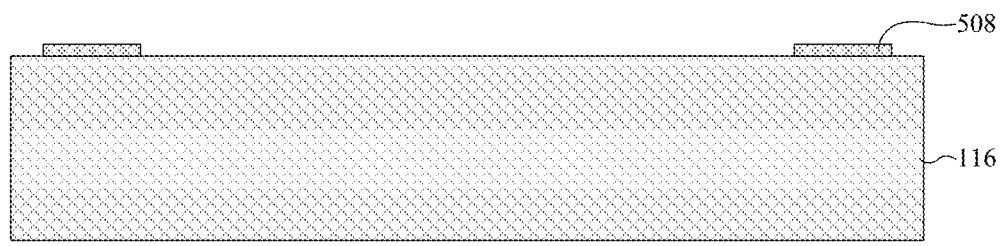

As shown in FIG. 18, an upper bond ring 508 is formed on a third semiconductor substrate 116. In some embodiments, the upper bond ring 508 is formed with a layout that corresponds to a layout of the lower bond ring 510. In some embodiments, a process for forming the upper bond ring 508 comprises forming a masking layer (not shown) over the third semiconductor substrate 116. The masking layer comprises a plurality of openings that expose portions of the third semiconductor substrate 116. A conductive layer (not shown) is then deposited on the masking layer and in the plurality of openings. In some embodiments, the conductive layer comprises, for example, Cu, Al, Au, Sn, some other bonding material, or a combination of the foregoing. In further embodiments, the conductive layer may be deposited by, for example, CVD, PVD, ALD, sputtering, electrochemical plating, electroless plating, some other deposition process, or a combination of the foregoing. Thereafter, a planarization process (e.g., CMP) is performed into the conductive layer, thereby forming the upper bond ring 508. Subsequently, in some embodiments, the masking layer is stripped away. In yet further embodiments, before the upper bond ring 508 is formed, one or more doped regions may be formed in the third semiconductor substrate 116 (e.g., via ion implantation).

Figure 19:
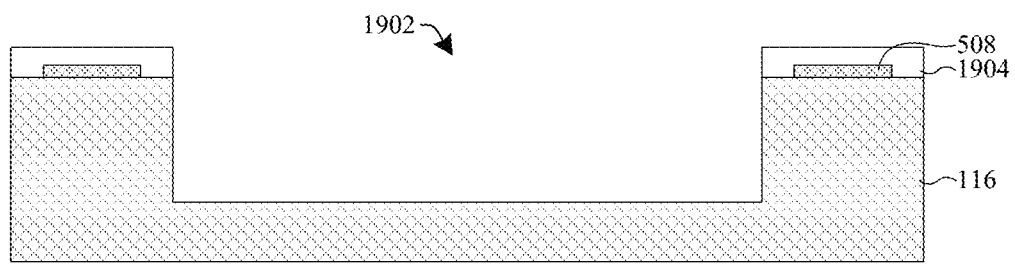

As shown in FIG. 19, a second opening 1902 is formed in the third semiconductor substrate 116. In some embodiments, a process for forming the second opening 1902 comprises depositing a first masking layer 1904 (e.g., negative/positive photoresist) on the third semiconductor substrate 116 and covering the upper bond ring 508. The third semiconductor substrate 116 is then exposed to an etchant. The etchant removes unmasked portions of the third semiconductor substrate 116, thereby forming the second opening 1902. In some embodiments, the first masking layer 1904 may be stripped away.

Figure 20:
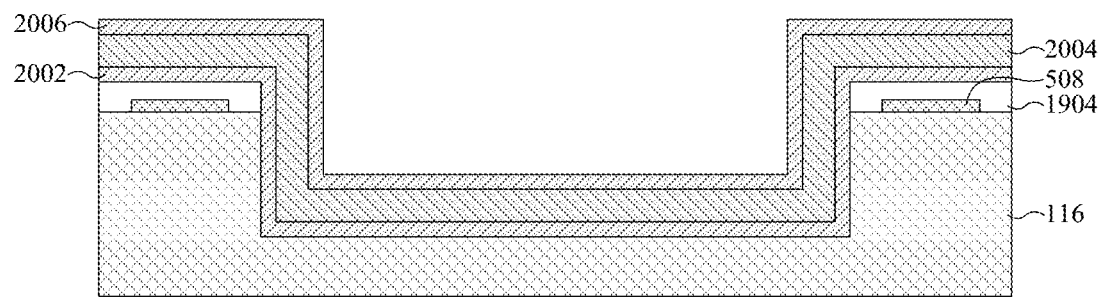

As shown in FIG. 20, a fourth conductive layer 2002 is formed over the third semiconductor substrate 116, the upper bond ring 508, and the first masking layer 1904. In some embodiments, the fourth conductive layer 2002 lines the second opening 1902 (see, e.g., FIG. 19). In further embodiments, a process for forming the fourth conductive layer 2002 comprises depositing the fourth conductive layer 2002 on the third semiconductor substrate 116 and the first masking layer 1904. The fourth conductive layer 2002 may be deposited by, for example, CVD, PVD, ALD, sputtering, electrochemical plating, electroless plating, some other deposition process, or a combination of the foregoing. In yet further embodiments, the fourth conductive layer 2002 may comprise, for example, Pt, Ti, Cu, Au, Al, Zn, Sn, some other conductive material, or a combination of the foregoing.

Also shown in FIG. 20, a second piezoelectric layer 2004 is formed over the fourth conductive layer 2002. In some embodiments, a process for forming the second piezoelectric layer 2004 comprises depositing the second piezoelectric layer 2004 on the fourth conductive layer 2002. The second piezoelectric layer 2004 may be deposited or grown by, for example, sputtering, a spin-on process, CVD, PVD, ALD, molecular-beam epitaxy, some other deposition or growth process, or a combination of the foregoing. In further embodiments, the second piezoelectric layer 2004 may comprise, for example, PZT, ZnO, $BaTiO_3$, $KNbO_3$, $Na_2WO_3$, $Ba_2NaNb_5O_5$, $Pb_2KNb_5O_{15}$, $La_3Ga_5SiO_{14}$, $GaPO_4$, $LiNbO_3$, $LiTaO_3$, some other piezoelectric material, or a combination of the foregoing.

Also shown in FIG. 20, a fifth conductive layer 2006 is formed over the second piezoelectric layer 2004. In some embodiments, a process for forming the fifth conductive layer 2006 comprises depositing the fifth conductive layer 2006 on the second piezoelectric layer 2004. The fifth conductive layer 2006 may be deposited by, for example, CVD, PVD, ALD, sputtering, electrochemical plating, electroless plating, some other deposition process, or a combination of the foregoing. In further embodiments, the fifth conductive layer 2006 may comprise, for example, Pt, Ti, Cu, Au, Al, Zn, Sn, some other conductive material, or a combination of the foregoing. In embodiments in which the dielectric structures 202 are disposed on the piezoelectric structures 128, respectively, the fifth conductive layer 2006 may not be formed over the second piezoelectric layer 2004.

Figure 21:
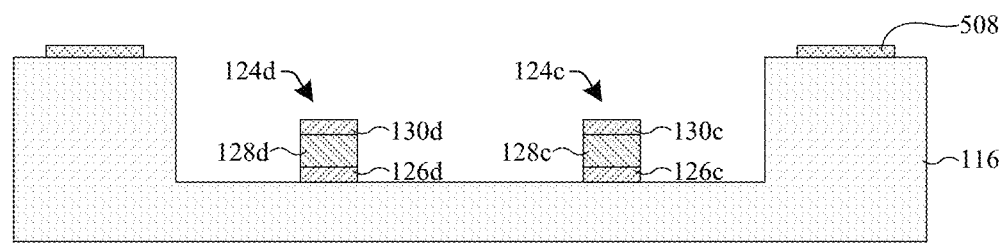

As shown in FIG. 21, a second plurality of piezoelectric anti-stiction structures 124 are formed over the third semiconductor substrate 116. In some embodiments, the piezoelectric anti-stiction structures 124 are formed within the second opening 1902 (see, e.g., FIG. 19). In some embodiments, a process for forming the piezoelectric anti-stiction structures 124 comprises forming a second masking layer (not shown) on the fifth conductive layer 2006 (see, e.g., FIG. 20). Thereafter, the fifth conductive layer 2006, the second piezoelectric layer 2004, and the fourth conductive layer 2002 (see, e.g., FIG. 20) are exposed to an etchant. The etchant removes unmasked portions of the fifth conductive layer 2006, thereby forming a plurality of conductive structures 130 on the second piezoelectric layer 2004; unmasked portions of the second piezoelectric layer 2004, thereby forming a plurality of piezoelectric structures 128 on the fourth conductive layer 2002; and unmasked portions of the fourth conductive layer 2002, thereby forming a plurality of electrodes 126 on the third semiconductor substrate 116.

Figure 22:
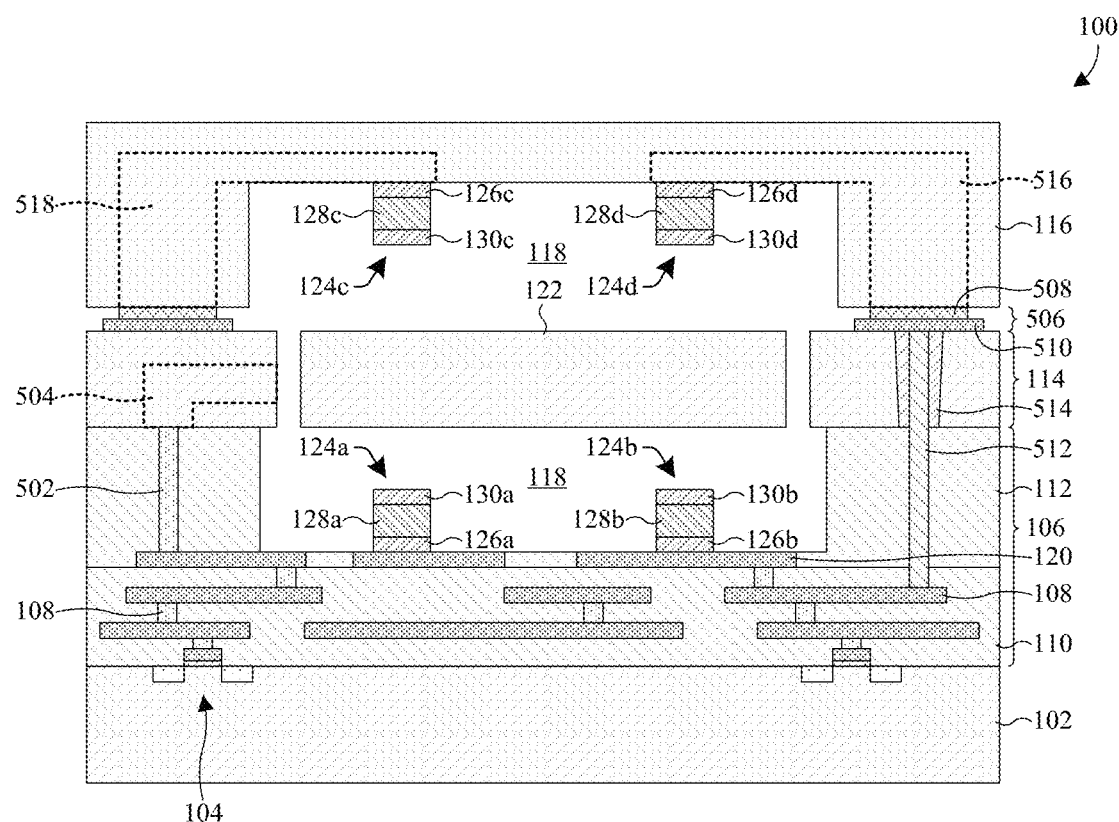

As shown in FIG. 22, the third semiconductor substrate 116 is bonded to the second semiconductor substrate 114, thereby forming an upper portion of the cavity 118. In some embodiments, the cavity 118 is formed as a sealed cavity. In further embodiments, a process for bonding the third semiconductor substrate 116 to the second semiconductor substrate 114 comprises bonding the upper bond ring 508 to the lower bond ring 510. The upper bond ring 508 may be bonded to the lower bond ring 510 by, for example, eutectic bonding. It will be appreciated that the third semiconductor substrate 116 may be bonded to the second semiconductor substrate 114 via other bonding processes (e.g., direct bonding, hybrid bonding, etc.). In yet further embodiments, after the third semiconductor substrate 116 is bonded to the second semiconductor substrate 114, formation of the MEMS device 100 is complete.

Figure 23:
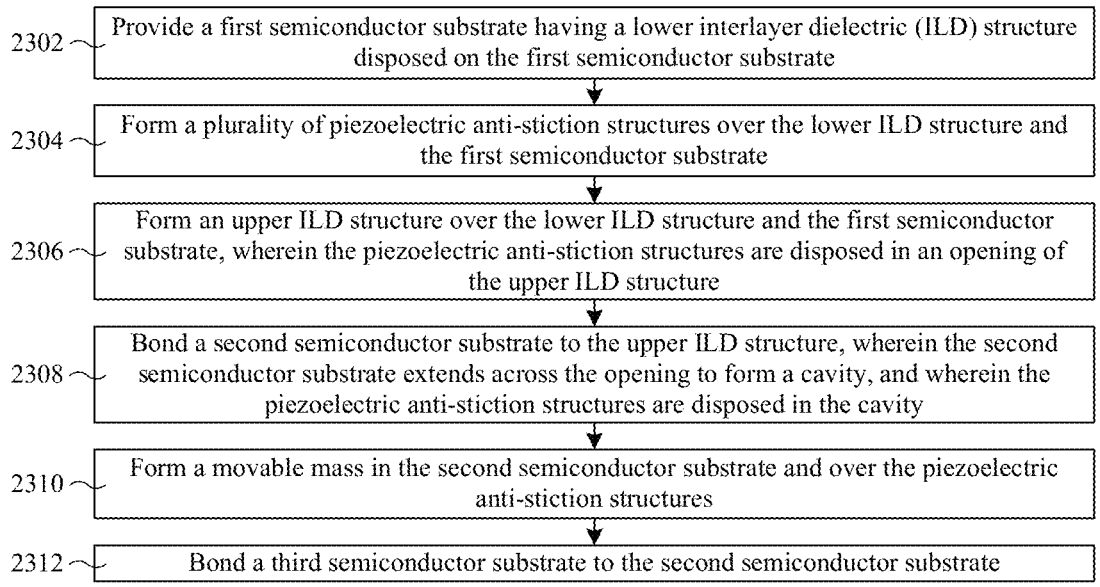
FIG. 23 illustrates a flowchart of some embodiments of a method for forming a MEMS device comprising a piezoelectric anti-stiction structure.

FIG. 23 illustrates a flowchart 2300 of some embodiments of a method for forming a MEMS device comprising a piezoelectric anti-stiction structure. While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2302, a first semiconductor substrate is provided having a lower interlayer dielectric (ILD) structure disposed on the first semiconductor substrate. FIG. 7 illustrates a cross-sectional view of some embodiments corresponding to act 2302.

At act 2304, a plurality of piezoelectric anti-stiction structures are formed over the lower ILD structure and the first semiconductor substrate. FIGS. 8-10 illustrate a series of cross-sectional views of some embodiments corresponding to act 2304.

At act 2306, an upper ILD structure is formed over the lower ILD structure and the first semiconductor substrate, wherein the piezoelectric anti-stiction structures are disposed in an opening of the upper ILD structure. FIGS. 11-13 illustrate a series of cross-sectional views of some embodiments corresponding to act 2306.

At act 2308, a second semiconductor substrate is bonded to the upper ILD structure, wherein the second semiconductor substrate extends across the opening to form a cavity, and wherein the piezoelectric anti-stiction structures are disposed in the cavity. FIG. 14 illustrates a cross-sectional view of some embodiments corresponding to act 2308.

At act 2310, a movable mass is formed in the second semiconductor substrate and over the piezoelectric anti-stiction structures. FIGS. 15-17 illustrate a series of cross-sectional views of some embodiments corresponding to act 2310.

At act 2312, a third semiconductor substrate is bonded to the second semiconductor substrate. FIGS. 18-22 illustrate a series of cross-sectional views of some embodiments corresponding to act 2312.

In some embodiments, the present application provides a microelectromechanical system (MEMS) device. The MEMS device comprises a first dielectric structure disposed over a first semiconductor substrate, wherein the first dielectric structure at least partially defines a cavity. A second semiconductor substrate is disposed over the first dielectric structure and comprises a movable mass, wherein opposite sidewalls of the movable mass are disposed between opposite sidewall of the cavity. A first piezoelectric anti-stiction structure is disposed between the movable mass and the first dielectric structure, wherein the first piezoelectric anti-stiction structure comprises a first piezoelectric structure and a first electrode disposed between the first piezoelectric structure and the first dielectric structure.

In some embodiments, the present application provides an integrated chip (IC). The IC comprises a microelectromechanical system (MEMS). The MEMS comprises: a semiconductor substrate; a movable mass spaced from the semiconductor; a cavity at least partially disposed between the semiconductor substrate and the movable mass, wherein opposite sidewalls of the movable mass are disposed between opposite sidewalls of the cavity; and a piezoelectric anti-stiction structure disposed on a surface of the cavity, wherein the piezoelectric anti-stiction structure comprises a piezoelectric structure and an electrode. Bias circuitry is electrically coupled to the electrode, wherein the bias circuitry is configured to provide a first voltage to the electrode.

In some embodiments, the present application provides a method for forming a microelectromechanical system (MEMS) device. The method comprises forming a first conductive layer on a lower interlayer dielectric (ILD) structure, wherein the lower ILD structure is disposed over a semiconductor substrate. A first conductive layer is formed on the lower ILD. A second conductive layer is formed on the first conductive layer. A piezoelectric layer is formed on the second conductive layer. The first piezoelectric layer and the second conductive layer are etched to form a piezoelectric structure and an electrode, respectively, wherein the piezoelectric structure is disposed on the electrode. The first conductive layer is etched to form the conductive line. An upper ILD structure is formed over the lower ILD structure, the conductive line, the electrode, and the piezoelectric structure. An opening is formed in the upper ILD structure that exposes the piezoelectric structure. A movable mass is formed over the upper ILD structure, wherein the movable mass is formed having opposite sidewalls disposed between opposite sidewalls of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) device, comprising:
a first dielectric structure disposed over a first semiconductor substrate, wherein the first dielectric structure at least partially defines a cavity, wherein an upper surface of the first dielectric structure at least partially defines a bottom surface of the cavity, the upper surface of the first dielectric structure is spaced from an uppermost surface of the first dielectric structure by a distance;
a second semiconductor substrate disposed over the first dielectric structure and comprising a movable mass, wherein opposite sidewalls of the movable mass are disposed between opposite sidewall of the cavity; and
a first piezoelectric anti-stiction structure disposed between the movable mass and the first dielectric structure, wherein the first piezoelectric anti-stiction structure comprises a first piezoelectric structure and a first electrode disposed between the first piezoelectric structure and the first dielectric structure, and wherein a height of the first piezoelectric anti-stiction structure is between about 30 percent and about 50 percent of the distance.

2. The MEMS device of claim 1, wherein the first piezoelectric anti-stiction structure comprises:
a first conductive structure disposed on the first piezoelectric structure, wherein the first piezoelectric structure separates the first electrode from the first conductive structure.

3. The MEMS device of claim 2, wherein the first electrode and the first conductive structure comprise a same chemical composition.

4. The MEMS device of claim 1, wherein the movable mass has a concentration of dopants greater than about $1 \times 10^{20}$ atoms/cm$^3$.

5. The MEMS device of claim 1, wherein the distance is between about 2 micrometers and about 3 micrometers.

6. The MEMS device of claim 1, further comprising:
a third semiconductor substrate disposed over both the first semiconductor substrate and the second semiconductor substrate, wherein the third semiconductor substrate defines an upper portion of the cavity.

7. The MEMS device of claim 6, further comprising:
a second piezoelectric anti-stiction structure disposed between the movable mass and a bottom surface of the third semiconductor substrate, wherein the second piezoelectric anti-stiction structure comprises a second piezoelectric structure and a second electrode disposed between the second piezoelectric structure and the bottom surface of the third semiconductor substrate, and wherein the bottom surface of the third semiconductor substrate at least partially defines an upper surface of the cavity.

8. The MEMS device of claim 7, wherein the second piezoelectric anti-stiction structure comprises:
a second conductive structure disposed on the second piezoelectric structure, wherein the second piezoelectric structure separates the second electrode from the second conductive structure.

9. The MEMS device of claim 1, further comprising:
an interconnect structure disposed in the first dielectric structure, wherein a conductive feature of the interconnect structure partially defines the cavity, and wherein the first electrode is electrically coupled to the conductive feature of the interconnect structure.

10. The MEMS device of claim 9, wherein the second conductive feature of the interconnect structure is an uppermost metal line of the interconnect structure.

11. An integrated chip (IC), comprising:
a semiconductor substrate;
a movable mass spaced from the semiconductor substrate;
a cavity at least partially disposed between the semiconductor substrate and the movable mass, wherein opposite sidewalls of the movable mass are disposed between opposite sidewalls of the cavity;
a dielectric structure disposed between the semiconductor substrate and the movable mass;
an interconnect structure embedded in the dielectric structure;
a conductive via extending vertically from the dielectric structure toward the movable mass, wherein the conductive via at least partially defines a conductive path that electrically couples the movable mass to the interconnect structure;
a first piezoelectric anti-stiction structure disposed on a first surface of the cavity, wherein the first piezoelectric anti-stiction structure comprises a first piezoelectric structure and a first electrode, wherein the first electrode is disposed between the first piezoelectric structure and a bottom surface of the cavity, and wherein the first piezoelectric structure is configured to change its shape based on an electric potential difference between the first electrode and the movable mass;
a second piezoelectric anti-stiction structure disposed on the first surface of the cavity, wherein the second piezoelectric anti-stiction structure is laterally spaced from the first piezoelectric anti-stiction structure, wherein the second piezoelectric anti-stiction structure comprises a second piezoelectric structure, a second electrode, and a second conductive structure, and wherein the second piezoelectric structure is disposed between the second electrode and the second conductive structure; and
a third piezoelectric anti-stiction structure disposed on a second surface of the cavity, wherein:
the second surface of the cavity is vertically spaced from the first surface of the cavity;
the movable mass is disposed vertically between the third piezoelectric anti-stiction structure and the second piezoelectric anti-stiction structure;
the third piezoelectric anti-stiction structure comprises a third piezoelectric structure, a third electrode, and a third conductive structure;
the third piezoelectric structure is disposed between the third electrode and the third conductive structure; and
the second piezoelectric structure is vertically spaced from the third piezoelectric structure by a greater distance than the second conductive structure is vertically spaced from the third conductive structure.

12. The IC of claim 11, further comprising:
a doped region disposed in the movable mass, wherein the doped region has a concentration of dopants greater than about $1 \times 10^{20}$ atoms/cm$^3$.

13. The IC of claim 12, wherein the first piezoelectric anti-stiction structure has:
a first shape when the movable mass is spaced from the first piezoelectric anti-stiction structure; and
a second shape different than the first shape when the movable mass contacts the first piezoelectric anti-stiction structure.

14. The IC of claim 11, wherein:
outer sidewalls of the first electrode are substantially aligned with outer sidewalls of the first piezoelectric structure, respectively.

15. An integrated chip (IC), comprising:
an interlayer dielectric (ILD) structure disposed over a first semiconductor substrate;
a second semiconductor substrate disposed over the ILD structure;
a third semiconductor substrate disposed over both the first semiconductor substrate and the second semiconductor substrate, wherein the third semiconductor substrate and the ILD structure both partially define a cavity, and wherein the second semiconductor substrate comprises a movable mass disposed within the cavity;
a piezoelectric anti-stiction structure disposed on a bottom surface of the third semiconductor substrate, wherein the piezoelectric anti-stiction structure comprises a piezoelectric structure and an electrode, wherein the electrode is disposed between the bottom surface of the third semiconductor substrate and the piezoelectric anti-stiction structure; and
a through substrate via (TSV) disposed in the ILD structure and the second semiconductor substrate, wherein the TSV is electrically coupled to the electrode of the piezoelectric anti-stiction structure.

16. The IC of claim 15, further comprising:
a bond structure disposed between the second semiconductor substrate and the third semiconductor substrate, wherein the TSV extends vertically through the ILD structure and the second semiconductor substrate to the bond structure, wherein the bond structure electrically couples the TSV to a first conductive channel that is disposed in the third semiconductor substrate and extends from the electrode to the bond structure.

17. The IC of claim 16, further comprising:
an upper conductive via disposed in the ILD structure, wherein the upper conductive via extends vertically through the ILD structure to the second semiconductor substrate, and wherein a second conductive channel extends from the upper conductive via to the movable mass, such that the movable mass is electrically coupled to the upper conductive via.

18. The MEMS device of claim 1, further comprising:
an interconnect structure disposed in the first dielectric structure; and
a conductive via disposed in the first dielectric structure, wherein the conductive via extends vertically from a first conductive feature of the interconnect structure to the second semiconductor substrate, and wherein the conductive via is electrically coupled to the movable mass via a conductive channel that extends through the second semiconductor substrate.

19. The IC of claim 11, wherein:
an upper surface of the dielectric structure at least partially defines the bottom surface of the cavity;
the upper surface of the dielectric structure is vertically spaced from an uppermost surface of the dielectric structure by a vertical distance; and
a height of the first piezoelectric anti-stiction structure is between about 30 percent and about 50 percent of the vertical distance.

20. The IC of claim 19, wherein a height of the second piezoelectric anti-stiction structure is between about 30 percent and about 50 percent of the vertical distance.

* * * * *